United States Patent
Choi et al.

(10) Patent No.: US 7,838,915 B2
(45) Date of Patent: Nov. 23, 2010

(54) SEMICONDUCTOR DEVICE HAVING MULTI-GATE STRUCTURE AND METHOD OF MANUFACTURING THE SAME

(75) Inventors: Jung-a Choi, Yongin-si (KR); Jeong-hawan Yang, Suwon-si (KR); You-scung Jin, Seoul (KR)

(73) Assignee: Samsung Electronics Co., Ltd., Suwon-Si (KR)

(*) Notice: Subject to any disclaimer, the term of this patent is extended or adjusted under 35 U.S.C. 154(b) by 762 days.

(21) Appl. No.: 10/590,101

(22) PCT Filed: Feb. 5, 2005

(86) PCT No.: PCT/KR2005/000357
§ 371 (c)(1),
(2), (4) Date: Jul. 25, 2007

(87) PCT Pub. No.: WO2005/078804
PCT Pub. Date: Aug. 25, 2005

(65) Prior Publication Data
US 2007/0272925 A1 Nov. 29, 2007

(30) Foreign Application Priority Data
Feb. 17, 2004 (KR) .................. 10-2004-0010472

(51) Int. Cl.
*H01L 29/94* (2006.01)

(52) U.S. Cl. ............... 257/288; 257/347; 257/401; 257/E27.112; 257/E29.028; 257/E29.13; 257/E29.259

(58) Field of Classification Search ........... 257/288, 257/347, 390, 401, 507, E27.11, E27.112, 257/E29.028, E29.13, E29.259, E29.264, 257/E27.111
See application file for complete search history.

(56) References Cited

U.S. PATENT DOCUMENTS

| | | | |
|---|---|---|---|
| 6,413,802 B1 | 7/2002 | Hu et al. ............... 438/151 |
| 6,716,686 B1* | 4/2004 | Buynoski et al. ....... 438/157 |
| 2004/0026736 A1 | 2/2004 | Grupp et al. ............ 257/330 |
| 2004/0036126 A1* | 2/2004 | Chau et al. .............. 257/401 |
| 2004/0262692 A1* | 12/2004 | Hareland et al. ......... 257/369 |

FOREIGN PATENT DOCUMENTS

| | | |
|---|---|---|
| JP | 63-015471 | 1/1988 |
| JP | 04-268767 | 9/1992 |
| JP | 08-181323 | 7/1996 |
| JP | 2003-197916 | 7/2003 |
| KR | 1020040075566 | 8/2004 |

* cited by examiner

Primary Examiner—Matthew E Warren
(74) Attorney, Agent, or Firm—F. Chau & Associates, LLC (57) ABSTRACT

Provided are a semiconductor device having a mesa-type active region including a plurality of slabs and a method of manufacturing the semiconductor device. The semiconductor device includes a first active region and a second active region. The first active region is formed in a line-and-space pattern on a substrate and includes the slabs, each slab having a first surface, a second surface facing a direction opposite to the first side, and a top surface. The first active region and the second active region are composed of identical or different materials. The second active region contacts at least one end of each of the slabs on the substrate to connect the slabs to one another. The method includes forming a first active region in a line-and-space pattern on the substrate and forming the second active region.

17 Claims, 13 Drawing Sheets

SEMICONDUCTOR DEVICE HAVING MULTI-GATE STRUCTURE AND METHOD OF MANUFACTURING THE SAME

TECHNICAL FIELD

The present invention relates to a semiconductor device and a method of manufacturing the same and, more particularly, to a semiconductor device and a method of manufacturing the same, the semiconductor device including a metal-oxide-semiconductor transistor having a multi-gate structure in which a channel is formed in a slab-shaped mesa-type active region.

BACKGROUND ART

To realize high-speed, high-performance, low-power-consuming semiconductor devices, efforts have been made to increase the integration density of integrated circuits (ICs) by scaling down the sizes of transistors included in the ICs, while maintaining superior operating capabilities of the transistors. To increase the integration density of the ICs, the feature sizes of the semiconductor devices must be reduced.

Field effect transistors (FETs) used to increase the integration density of complementary MOS (CMOS) transistors include multi-gate transistors (for example, '35 nm CMOS FinFETs', Symposium on VLSI Technology Digest of Technical Papers, pp. 104-105, 2002 by Fu-Liang Yang et al. and 'High Performance Fully-Deleted Tri-Gate CMOS Transistors', IEEE Electron Device Letters, Vol. 24, No. 4, April, 2003, pp. 263-365 by B. S. Doyle et al.). A multi-gate transistor includes a fin-shaped silicon body formed using a silicon-on-insulator (SOI) wafer and a gate formed on the surface of the fin-shaped silicon body.

The multi-gate transistor having the fin-shaped silicon body has a three-dimensional channel, which is useful for scaling the CMOS transistors. It is widely known that, with its fully depleted SOI structure, a multi-gate transistor offers superior sub-threshold characteristics and is capable of controlling electric currents without increasing the length of a gate. In addition, the multi-gate transistor does not suffer from a short channel effect (SCE) in which the potential of a channel region is affected by a drain voltage. In particular, a tri-gate CMOS transistor uses a channel formed around its three surfaces. Therefore, when designing an active region where a channel will be formed, a tri-gate CMOS transistor has greater margin for design in width and height of an active region than a FinFET.

Figure 1A:
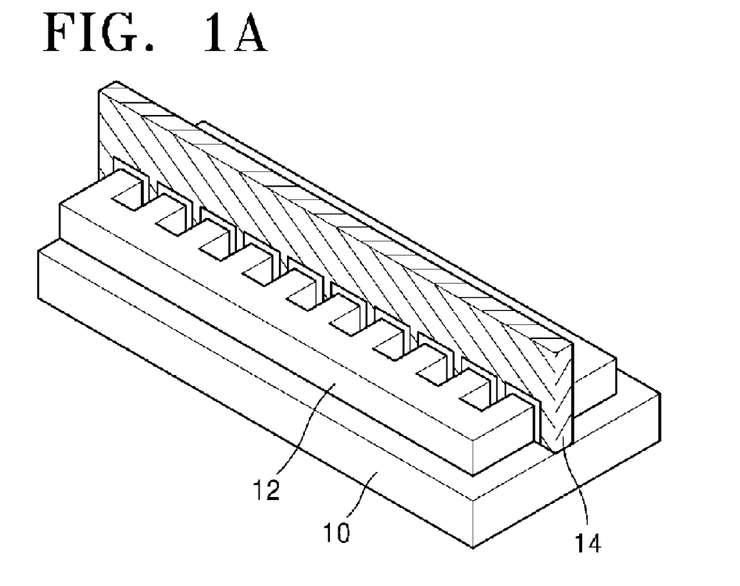
FIG. 1A is a schematic view of a conventional multi-gate transistor.

FIG. 1A is a perspective view of a conventional multi-gate transistor. Referring to FIG. 1A, when manufacturing the multi-gate transistor, a silicon active region 12 serving as a source/drain is formed as mesa-type slabs on a buried oxide film 10. A channel passes through a portion of a gate line 14 covering a top surface and both sides of the silicon active region 12.

Electrical characteristics of the multi-gate transistor are greatly affected by the size (i.e., height and width) and the shape (i.e., a curvature or a rounding profile seen from above) of the silicon active region 12. In other words, non-uniform sizes and shapes of slabs of the silicon active region 12 covered by the gate line 14 may result in variations in the performance of the multi-gate transistor or degradation of its electrical characteristics.

Figure 1B:
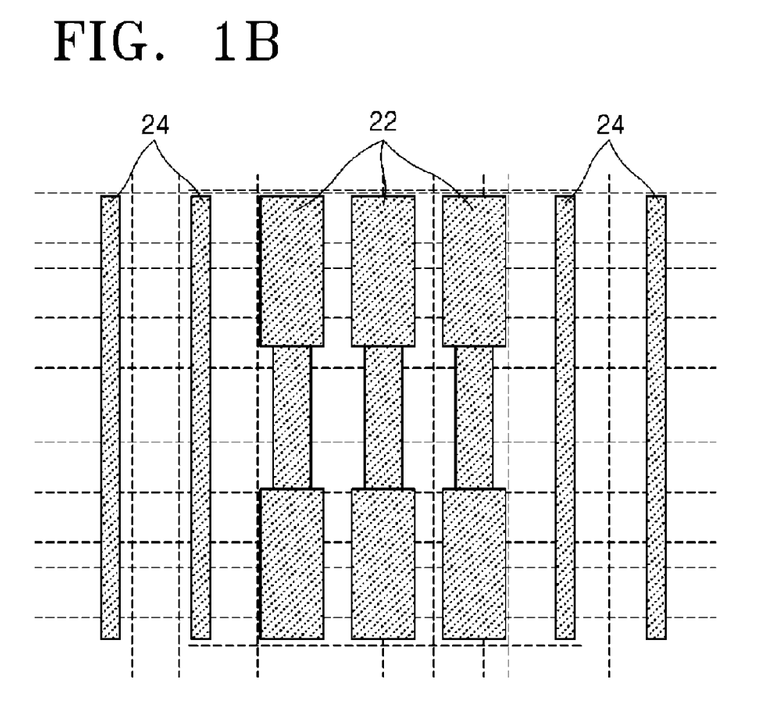
FIG. 1B illustrates a reticle pattern including an optical proximity correction (OPC) used when performing a lithography process for patterning an active region according to a conventional method of manufacturing a semiconductor device.

FIG. 1B illustrates a reticle pattern in which an optical proximity correction (OPC) is applied when performing a lithography process for patterning an active region according to a conventional method of manufacturing a semiconductor device.

Referring to FIG. 1B, when patterning the silicon active region 12 shaped as illustrated in FIG. 1A, a reticle pattern including the OPC is used to prevent problems caused by a proximity effect of the lithography process. The recticle pattern includes slab patterns 22 of the silicon active region 12, and dummy patterns 24. In other words, in the prior art, each slab in the silicon active region 12 is independently patterned using the reticle pattern employing the OPC, and the slabs are connected to one another using lithography characteristics.

Figure 1C:
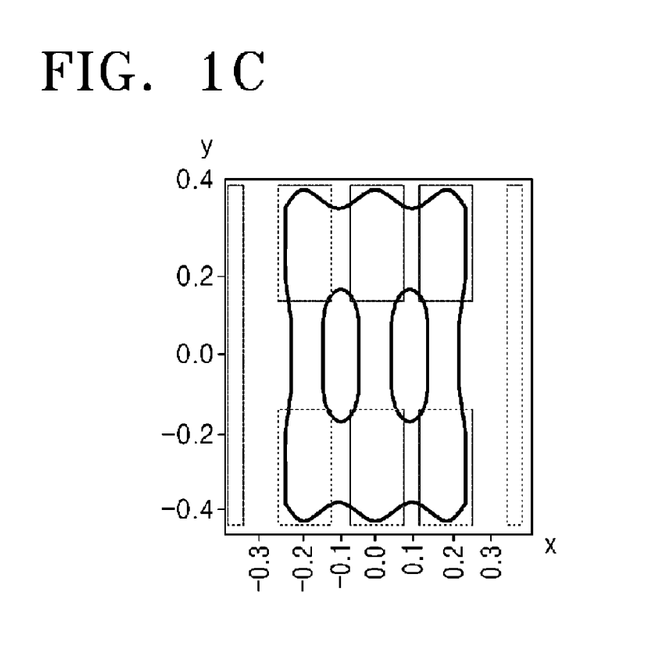
FIG. 1C is a plan view of the active region formed using a multi-gate reticle including the OPC.

When performing the lithography process using the reticle pattern illustrated in FIG. 1B, an active region pattern 30 having a 'rounding' phenomenon is very likely to be formed as illustrated in FIG. 1C. FIG. 1C is a plan view of the silicon active region 12 formed using a multi-gate reticle including the OPC.

As the pitch of each of the slabs in the silicon active region 12 decreases, the slabs sustain more profile rounding and more CD (critical dimension) variations in a stage of after-development inspection (ADI) when forming the silicon active region 12 using the OPC as described with reference to FIG. 1B due to a resolution limitation of the lithography process. In particular, when forming a transistor in which a plurality of slabs extend parallel to one another, it is more difficult to pattern the active region to have a uniform profile and CD.

DISCLOSURE OF INVENTION

Technical Problem

Consequently, many problems may occur when forming the silicon active region 12 shaped as in FIG. 1A. For example, poor pattern profiles may result from the lithography process, non-uniform sizes of the slabs may be formed during an etching process, unwanted silicon remnants may be formed on the silicon active region 12 after the etching process, and a gap may not be opened to cause 'not open' phenomenon between the slabs during the etching process. Also, referring to FIG. 1C, when the gate line 14 is misaligned in a y direction on the silicon active region 12 having the pattern-rounding phenomenon, a large variation in the performance of the multi-gate transistor is unavoidable.

Technical Solution

The present invention provides a semiconductor device capable of achieving consistent performance and good electrical characteristics for a multi-gate transistor since the semiconductor device includes an active region with a stable and uniform profile and a controlled critical dimension (CD).

The present invention also provides a method of manufacturing a semiconductor capable of securing a reproducible profile and a controllable CD of an active region in a stable manner when forming a multi-gate transistor.

According to an aspect of the present invention, there is provided a semiconductor device including a first active region and a second active region connected to each other. The first active region is formed in a line-and-space pattern and includes a plurality of slabs formed on a substrate, each slab having a first surface, a second surface facing a direction opposite to the first side, and a top surface. The first active region and the second active region are composed of identical or different materials. The second active region contacts at least one end of each of the slabs on the substrate to connect the slabs to one another. A gate line is formed on the first surface, the second surface, and the top surface of each of the slabs. A gate dielectric layer is interposed between the slabs and the gate line.

The top surface of each of the slabs is disposed a first distance above the substrate, and a top surface of the second active region is disposed a second distance above the substrate. The second distance is equal to or greater than the first distance.

The second active region contacts both ends of each of the slabs and extends in a direction orthogonal to a direction in which the slabs extend. The second active region may have an overlap region that contacts a portion of the first surface, the second surface, and the top surface of each of the slabs.

The gate line may extend in a direction orthogonal to the direction in which the slabs extend and parallel to the direction in which the second active region extends. A first channel region and a second channel region respectively are disposed in areas adjacent to the first surface and the second surface of each of the slabs in the first active region and facing the gate line. To form a tri-gate transistor, the semiconductor device further includes a third channel region adjacent to the top surface of each of the slabs in the first active region and facing the gate line.

According to another aspect of the present invention, there is provided a method of manufacturing a semiconductor device. The method includes forming a first active region having a line-and-space pattern on a substrate. A second active region contacts at least a portion of the first active region on the substrate. The first active region is composed of a first material and the second active region is composed of a second material. The second material is identical to or different from the first material. A gate dielectric layer is formed on the first active region. A gate is formed on the gate dielectric layer.

To form the second active region, a mask pattern covering a portion of each of the slabs is formed on the substrate such that both of the ends of each of the slabs are exposed. Thereafter, a second material layer covering both of the exposed ends of each of the slabs and the mask pattern is formed by depositing the second material. Then, the second material layer is planarized.

ADVANTAGEOUS EFFECTS

In the present invention, an active region of a multi-gate transistor is divided into a first active region and a second active region. Therefore, when forming an active region with a design rule of less than 300 nm, problems caused by a resolution limitation of a lithography process may be prevented. Also, problems caused by CD variations in the active region may be solved. In this regard, a semiconductor device according to embodiments of the present invention may be able to secure a re-producible profile and a controllable CD of an active region in a stable manner and provide consistent performance and good electrical characteristics of a multi-gate transistor.

DESCRIPTION OF DRAWINGS

The above and other features and advantages of the present invention will become more apparent by describing in detail exemplary embodiments thereof with reference to the attached drawings in which.

BEST MODE

The present invention will now be described more fully with reference to the accompanying drawings, in which exemplary embodiments of the invention are shown. The invention may, however, be embodied in many different forms and should not be construed as being limited to the embodiments set forth therein; rather, these embodiments are provided so that this disclosure will be thorough and complete, and will fully convey the concept of the invention to those skilled in the art. In the drawings, the thickness of layers and regions are exaggerated for clarity.

FIGS. 2 through 17 are perspective views illustrating a method of manufacturing a semiconductor device according to a first embodiment of the present invention.

Figure 2:
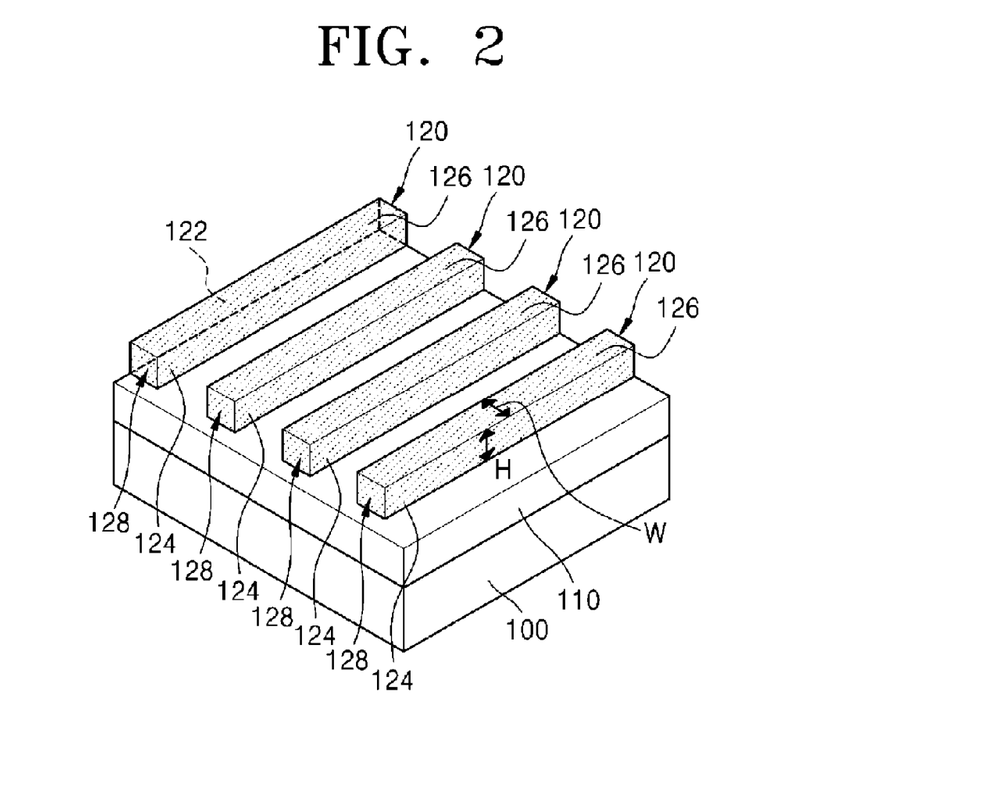
FIGS. 2 through 17 are perspective views illustrating a method of manufacturing a semiconductor device according to a first embodiment of the present invention.

Referring to FIG. 2, a silicon-on-insular (SOI) substrate including a silicon substrate 100, a buried oxide layer 110, and a silicon layer, which is formed of a monocrystalline layer, stacked sequentially is prepared. The SOI substrate 100 may be manufactured using a separation by implementation of oxygen (SIMOX) process. The buried oxide layer 110 can have a thickness of, for example, approximately 1000 Å-1500 Å.

A plurality of slabs 120 are formed on the buried oxide layer 110 to form a mesa-type active region with a line-and-space-pattern shape by patterning the SOI layer using an etching process in which a photoresist pattern or a hard mask pattern is used as an etch mask. The slabs 120 form a first active region. Each of the slabs 120 includes a first surface 122 and a second surface 124 perpendicular to a main surface of the silicon substrate 100 and a top surface 126 parallel to the main surface of the silicon substrate 100. The width W and the height H of each of the slabs 120 may be less than approximately 50 nm and 70 nm, respectively. However, the present invention is not limited to this.

Figure 3:
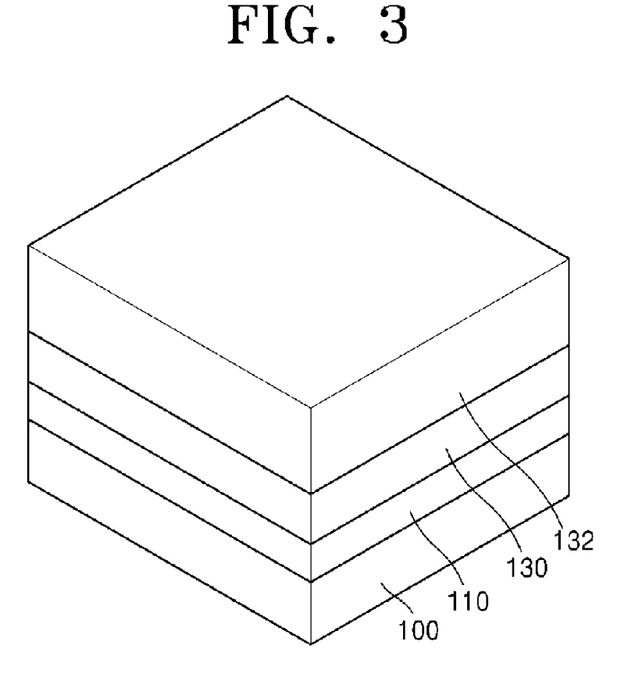

Referring to FIG. 3, a mask layer 130 completely covering the slabs 120 is formed on the buried oxide layer 110, and a photoresist layer is formed on the mask layer 130.

The mask layer 130 may be a single layer, for example, a SiON layer, a $Si_3N_4$ layer, or a $SiO_2$ layer, or a multi-layer, i.e., a combination of the same. For example, the mask layer 130 may be a double layer including the SiON layer and the $Si_3N_4$ layer. The SiON layer may be formed right on the slabs 120 to contact the slabs 120 and the $Si_3N_4$ layer may be formed on the SiON layer to form a top surface of the mask layer 130. The SiON layer in the lower part of the mask layer 130 may prevent silicon (Si) of which the slabs 120 are composed from being damaged by external factors, and the $Si_3N_4$ in the upper part of the mask layer 130 have superior polishing characteristics in a chemical mechanical polishing (CMP) process that follows.

Figure 4:
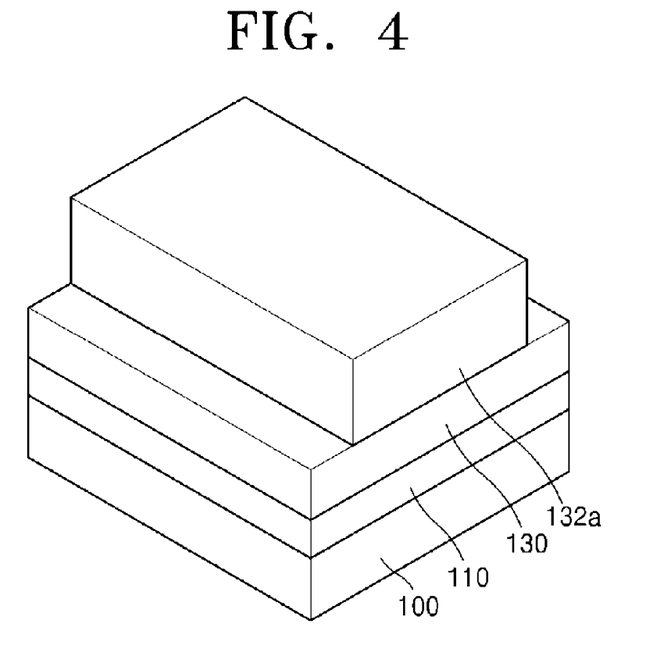

Referring to FIG. 4, a photoresist pattern 132a partially exposing the mask layer 130 is formed by patterning the photoresist layer 132.

Figure 5:
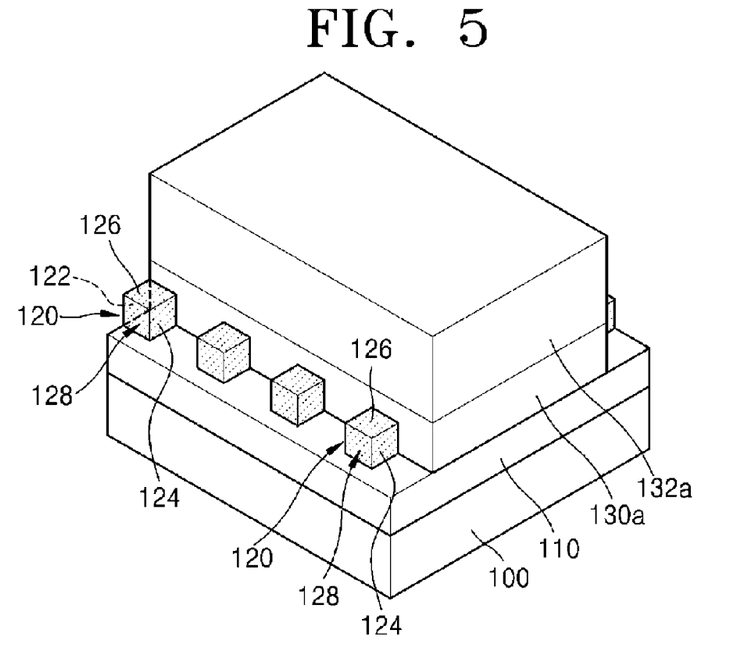

Referring to FIG. 5, the mask layer 130 is etched using the photoresist pattern 132a as an etch mask such that a mask pattern 130a exposing both ends 128 of each of the slabs 120 is formed. The first surface 122, the second surface 124, and the top surface 126 of each of the slabs 120 adjacent to the ends 128 are partially exposed.

Figure 6:
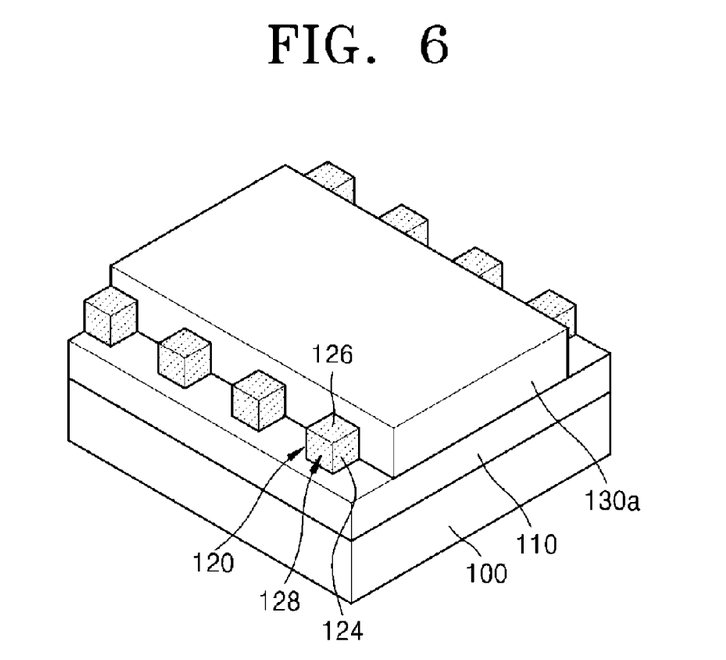

Referring to FIG. 6, the photoresist pattern 132a is removed to expose the top surface of the mask pattern 130a.

Figure 7:
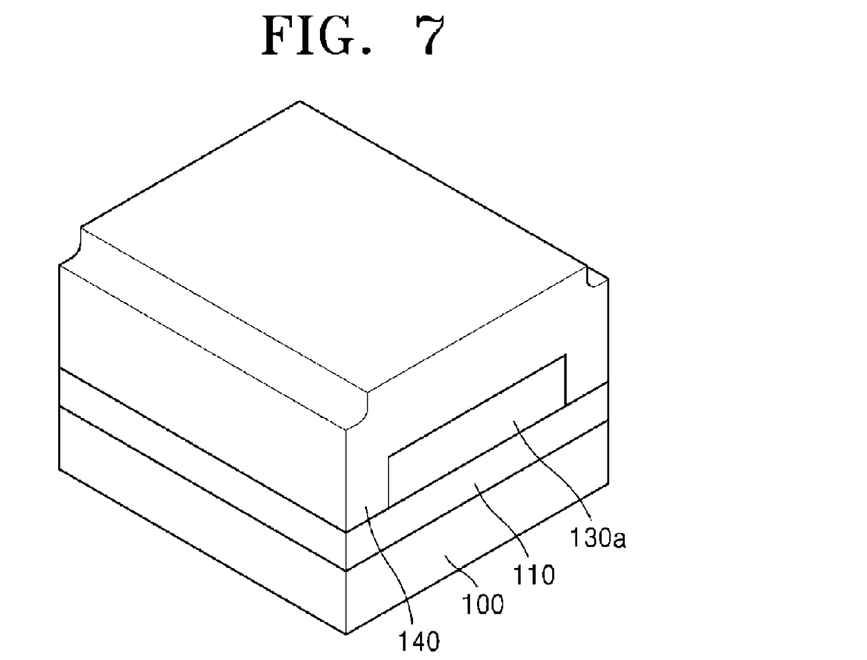

Referring to FIG. 7, a semiconductor layer 140 completely covering the mask pattern 130a and the exposed portions of the slabs 120 is formed. The semiconductor layer 140 may be formed by, for example, low pressure chemical vapor deposition (LPCVD). The semiconductor layer 140 is composed of a substance containing silicon that is identical to or different from the monocrystalline silicon of which the slabs 120, i.e., the first active region, are composed. The semiconductor layer 140 may be composed of polysilicon, amorphous silicon, or a semiconductor compound containing silicon such as $Si_{1-x}Ge_x$ (0<x<1). Preferably, the semiconductor layer 140 is composed of polysilicon. The semiconductor layer 140 may be formed to a thickness of hundreds to thousands of Å.

Figure 8:
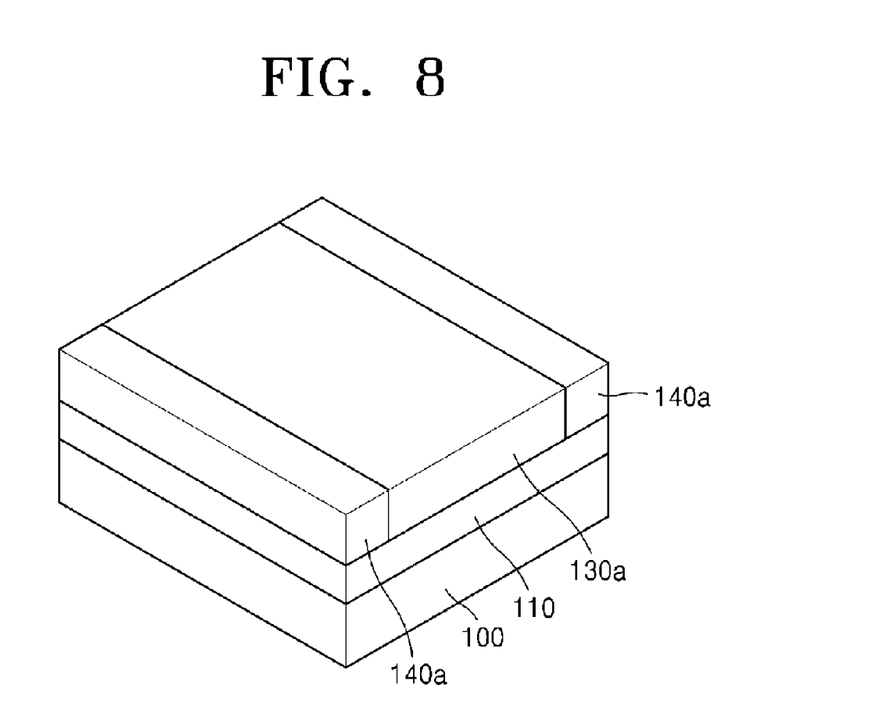

Referring to FIG. 8, the semiconductor layer 140 is planarized using CMP or an etch back method until the mask pattern 130a is exposed such that a second active region 140a covering both of the ends 128 of each of the slabs 120 is formed. The second active region 140a covers end portions of the first surface 122, the second surface 124, and the top surface 126 of each of the slabs 120. The slabs 120, i.e., the first active region, are connected to one another by the second active region 140a.

Figure 9:
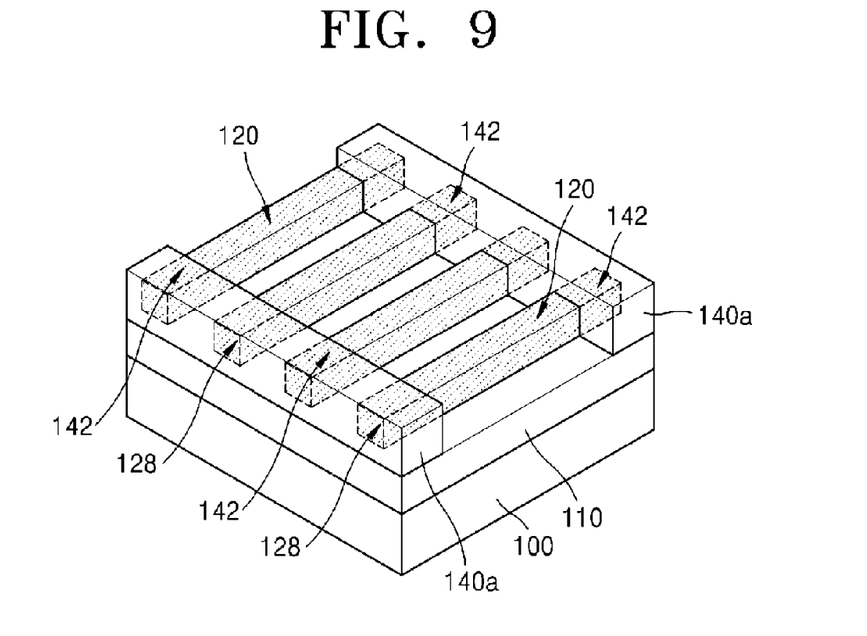

Referring to FIG. 9, the mask pattern 130a is removed by ashing and wet-etching.

As a result, the slabs 120, i.e., the first active region and the second active region 140a connecting the slabs 120 to one another are completely exposed on the buried oxide layer 110. The second active region 140a contacts both of the ends 128 of each of the slabs 120 and extends in a direction orthogonal to a direction in which the slabs 120 extend. In addition, the second active region 140a has an overlap portion 142 that contacts a portion of the first surface 122, the second surface 124, and the top surface 126 of each of the slabs 120. An end surface of each of the ends 128 of each of the slabs 120 may or may not be covered by the second active region 140a. In FIG. 9, the end surface of one end 128 of each of the slabs 120 is illustrated as being covered by the second active region 140a while the end surface of the other end 128 of each of the slabs 120 is illustrated as being not covered by the second active region 140a.

A top surface of the second active region 140a is higher than the top surfaces 126 of the slabs 120, that is, the first active region. Therefore, the distance between the silicon substrate 100 or the buried oxide layer 110 and the top surface of the second active region 140a is greater than the distance between the silicon substrate 100 or the buried oxide layer 110 and the top surfaces 126 of the slabs 120.

Figure 10:
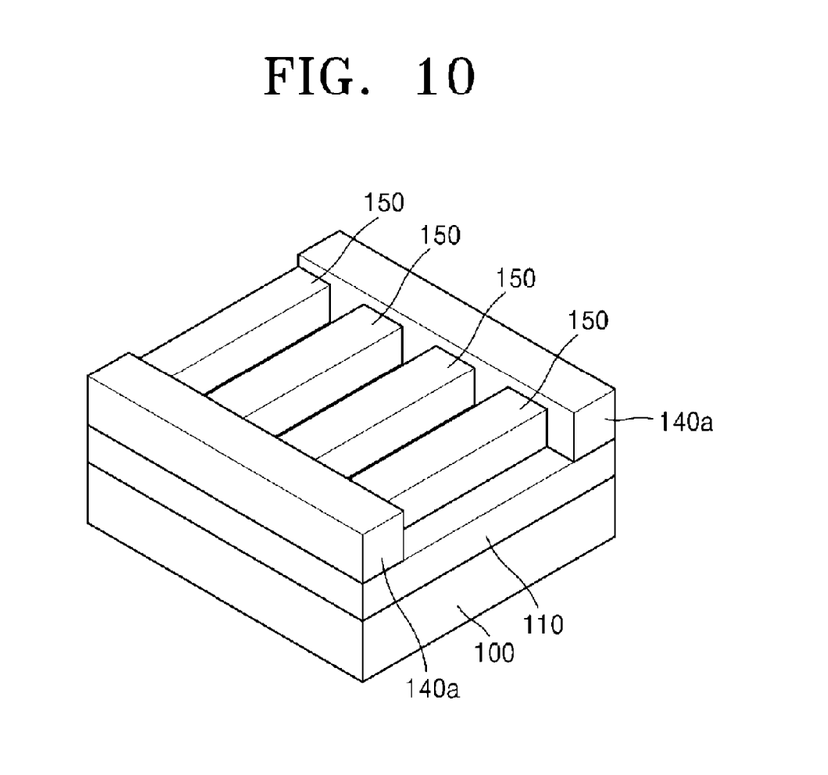

Referring to FIG. 10, an insulating layer 150 is formed on the slabs 120, i.e., the first active region. The insulating layer 150 forms a gate dielectric layer. The insulating layer 150 may be obtained by growing a desired film material on the surfaces of the slabs 120 using thermal oxidization. Alternatively, the insulating layer 150 may be formed by CVD or atomic layer deposition (ALD). For example, the insulating layer 150 may be composed of $SiO_2$, SiON, $Si_3N_4$, $Ge_xO_yN_z$, or $Ge_xSi_yO_z$, or a high dielectric material such as a metallic oxide. The metallic oxide may $HfO_2$, $ZrO_2$, $Al_2O_3$, $TiO_2$, or $Ta_2O_5$. Furthermore, the insulating layer 150 may be a multilayer composed of two or more types of film materials selected from the film materials mentioned above. The insulating layer 150 may be formed on the second active region 140a, which, however, is not a problem since the insulating layer 150 on the second active region 140a will be removed later.

Figure 11:
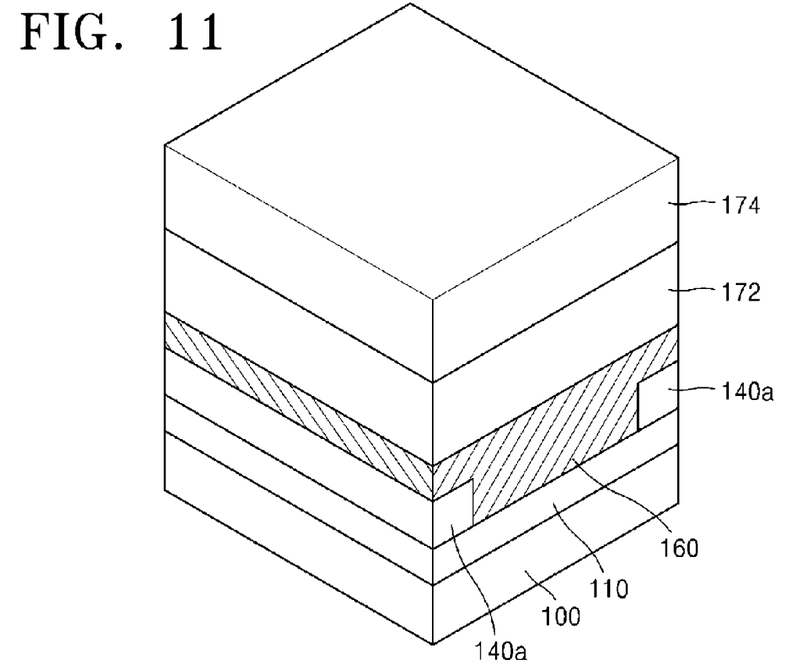

Referring to FIG. 11, a conductive layer 160 is formed on the second active region 140a and the insulating layer 150 to form a gate line, and a mask layer 172 and a photoresist layer 174 are sequentially formed on the conductive layer 160. The conductive layer 160 may be a conductive poly-silicon layer, a metallic layer, a metallic nitride layer, or a metal silicide layer. The conductive layer 160 completely covers the first surface 122, the second surface 124, and the top surface 126 of each of the slabs 120 with the insulating layer 150 interposed therebetween. The mask layer 172 may be, for example, an $Si_3N_4$ layer. In some cases, the mask layer 172 may be omitted.

Figure 12:
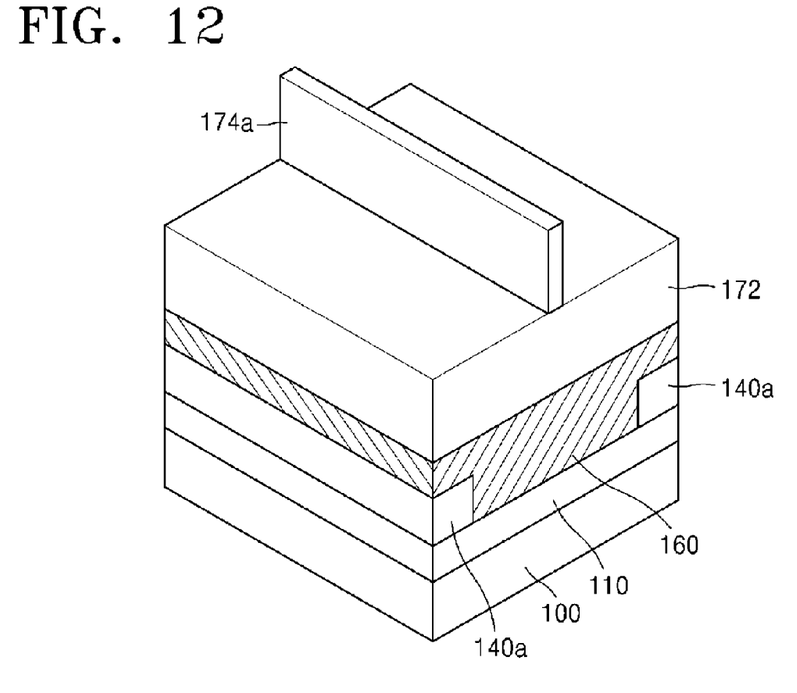

Referring to FIG. 12, a photoresist pattern 174a covering a region where the gate line will be formed is formed by patterning the photoresist layer 174.

Figure 13:
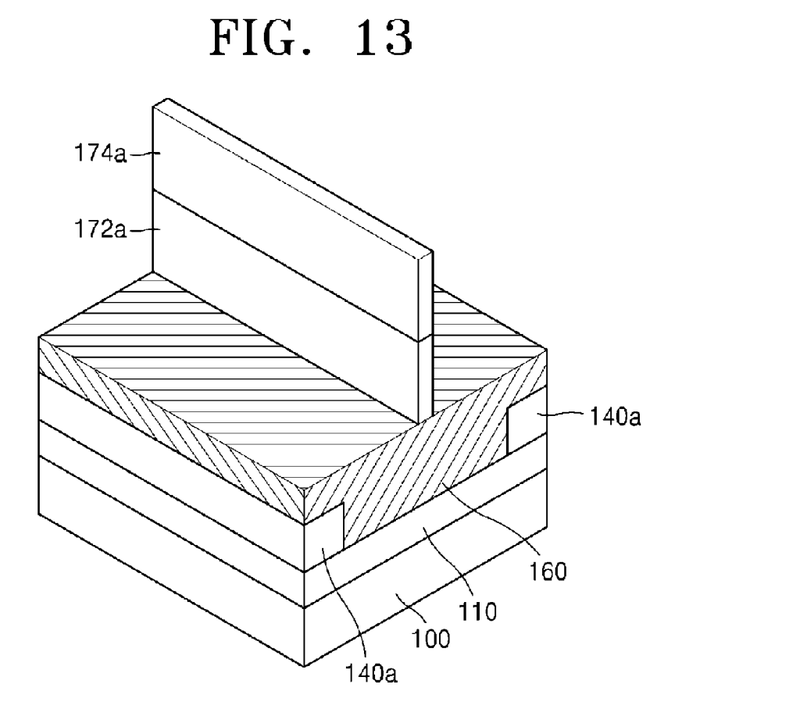

Referring to FIG. 13, a mask pattern 172a is formed by etching an exposed portion of the mask layer 172 using the photoresist pattern 174a as an etch mask. Thus, a portion of the conductive layer 160 around the mask pattern 172a is exposed.

Figure 14:
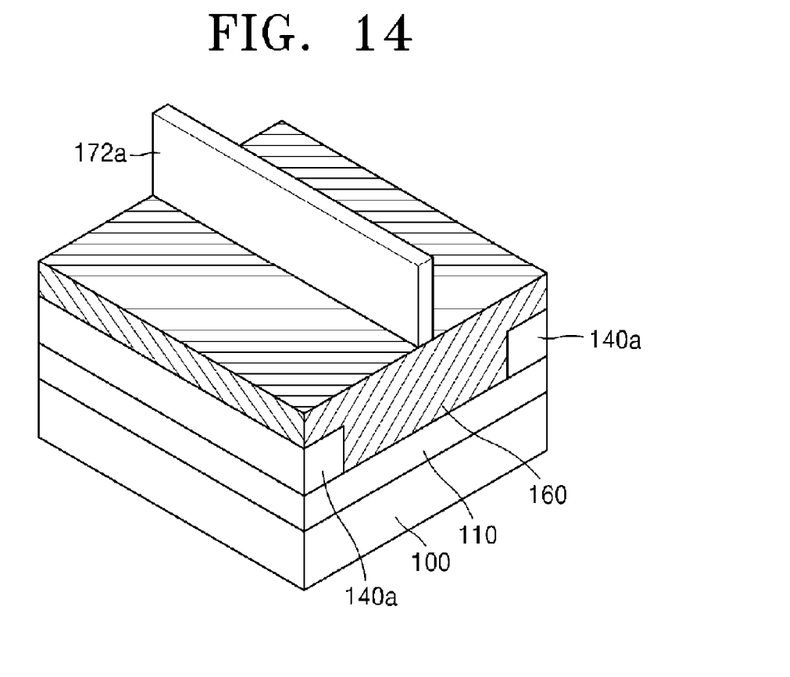

Referring to FIG. 14, the photoresist pattern 174a is removed to expose a top surface of the mask pattern 172a.

Figure 15:
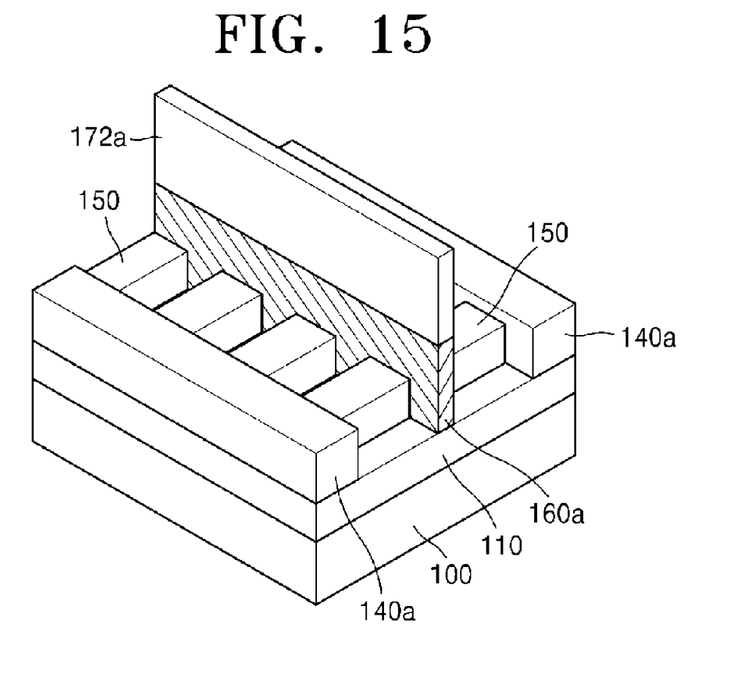

Referring to FIG. 15, a gate line 160a is formed by anisotropically etching the conductive layer 160 using the mask pattern 172a as an etch mask. If the mask layer 172 is not formed in an earlier process, the photoresist pattern 174a may be used as an etch mask. The gate line 160a extends in a direction orthogonal to the direction in which the slabs 120 extend and parallel to the direction in which the second active region 140a extends. After the gate line 160a is formed, the insulating layer 150 covering the slabs 120 around the gate line 160a is exposed.

Figure 16:
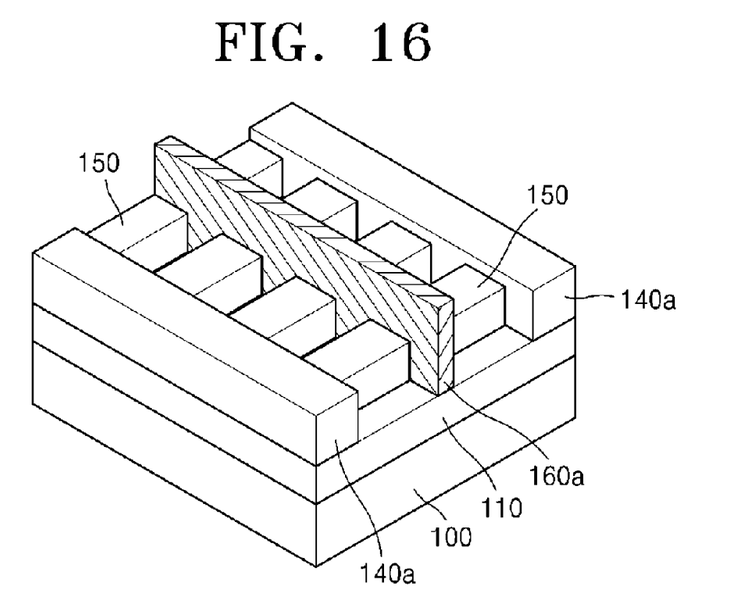

Referring to FIG. 16, a top surface of the gate line 160a is exposed by removing the mask pattern 172a.

Figure 17:
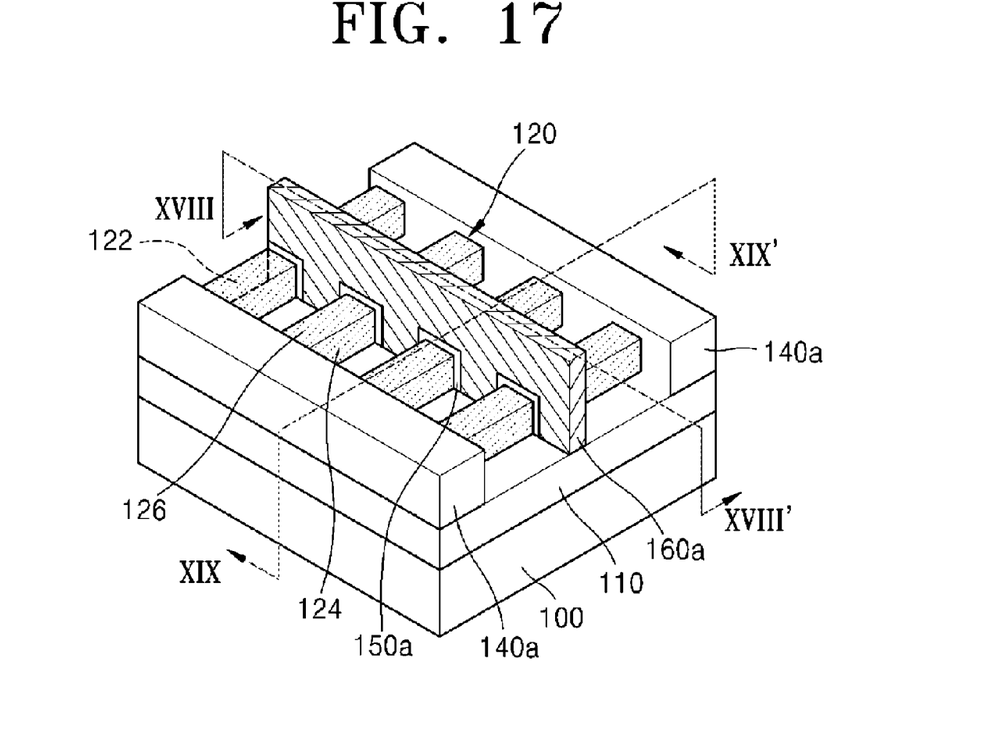

Referring to FIG. 17, the insulating layer 150 covering the surfaces of the slabs 120 is removed. If the insulating layer 150 was formed on the second active region 140a, it is removed as well. As a result, each of the slabs 120 is exposed around the gate line 160a and the gate dielectric layer 150a remains between the first surface 122, the second surface 124 and the top surface 126 of each of the slabs 120, and the gate line 160a at approximately the central parts of the slabs 120.

Thereafter, using a conventional method, insulating spacers (not shown) are formed on sidewalls of the gate line 160a. Then, ion-implanting and annealing are performed to form a source/drain.

Figure 18:
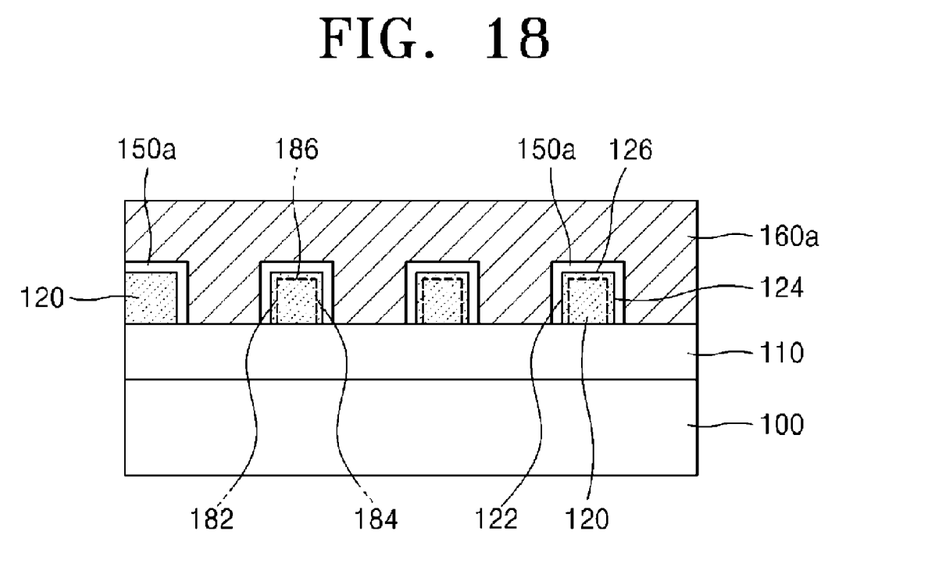
FIG. 18 is a cross-sectional view of the semiconductor device taken along a line XVIII-XVIII' of FIG. 17.
Figure 19:
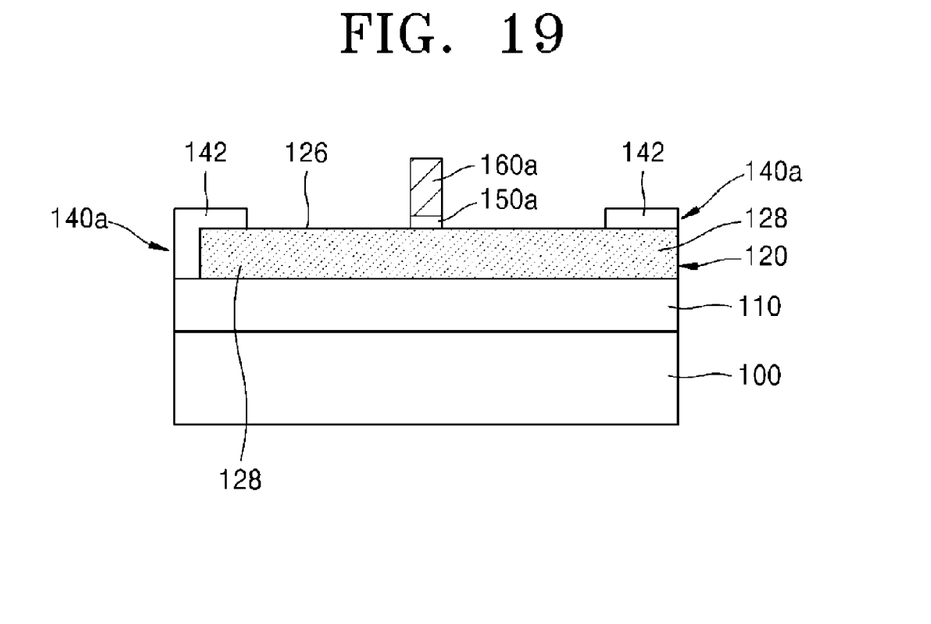
FIG. 19 is a cross-sectional view of the semiconductor device taken along a line XIX-XIX' of FIG. 17.

FIG. 18 is a cross-sectional view of the semiconductor device taken along a line XVIII-XVIII' of FIG. 17. FIG. 19 is a cross-sectional view of the semiconductor device taken along a line XIX-XIX' of FIG. 17.

Referring to FIG. 18, the gate dielectric layer 150a is interposed between the first surface 122, the second surface 124 and the top surface 126 of each of the slabs 120, i.e., the first active region, and the gate line 160a. respectively. Each of the slabs 120 includes a first channel region 182, a second channel region 184, and a third channel region 186 adjacent to the first surface 122, the second surface 124 and the top surface 126, respectively. In other words, a tri-gate structure in which three channels are formed around three surface of a slab, respectively, is implemented. However, the present invention is not limited to this structure. Those of ordinary skill in the art will be able to implement a FinFET structure by simply modifying a process design within the scope of the present invention. When implementing the FinFET structure, channels are formed only in the first channel region 182 and the second channel region 184 adjacent to the first surface 122 and the second surface 124 of each of the slabs 120, respectively.

Referring to FIG. 19, the second active region 140a connecting the slabs 120, i.e., the first active region, to one another, on the buried oxide layer 110 contacts the ends 128 of each of the slabs 120. In addition, the second active region 140a has an overlap region 142 contacting a portion of each of the first surface 122, the second surface 124 and the top surface 126 of each of the slabs 120.

As illustrated in FIG. 19, the end surface of one end 128 of each of the slabs 120 is covered by the second active region 140a while the end surface of the other end 128 of each of the slabs 120 is not covered by the second active region 140a.

Mode for Invention

Figure 20:
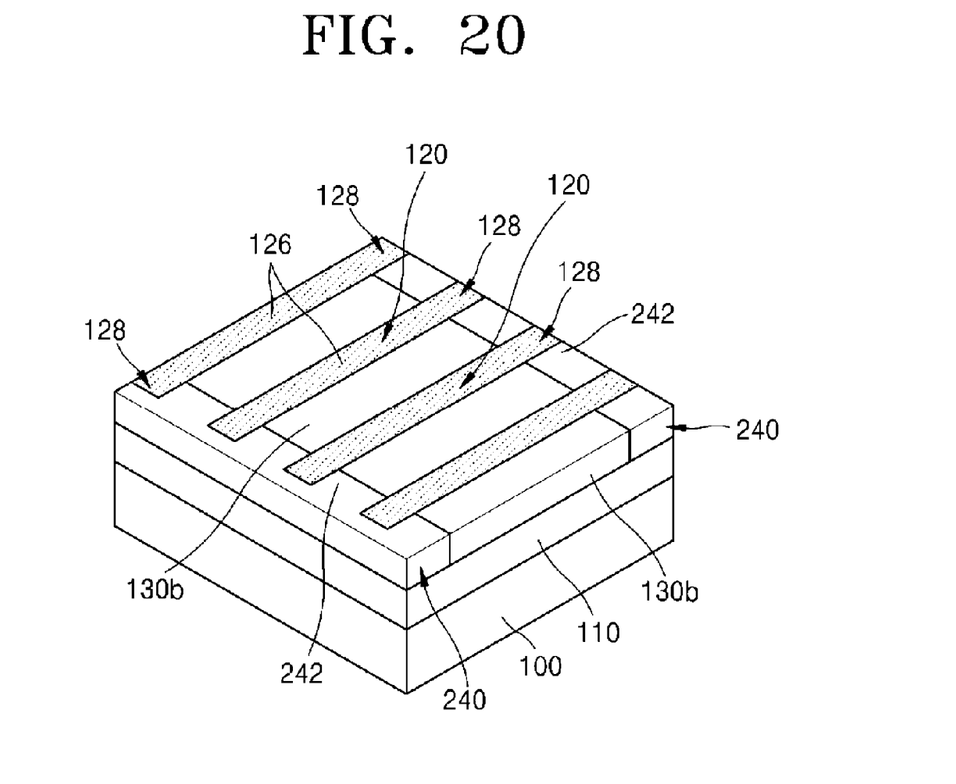
FIGS. 20 through 22 are perspective views illustrating a method of manufacturing a semiconductor device according to a second embodiment of the present invention.
Figure 21:
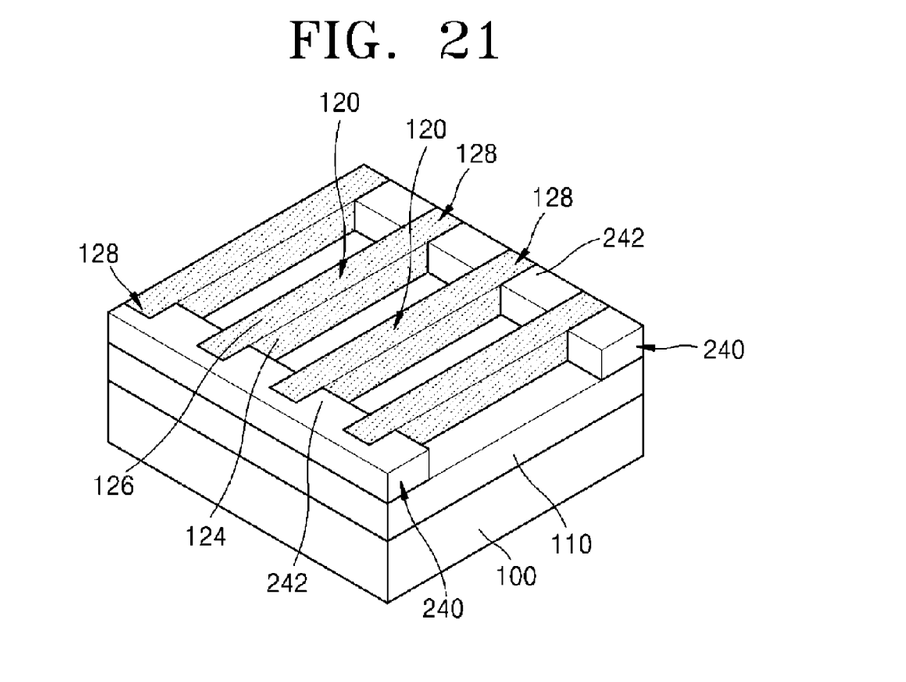
Figure 22:
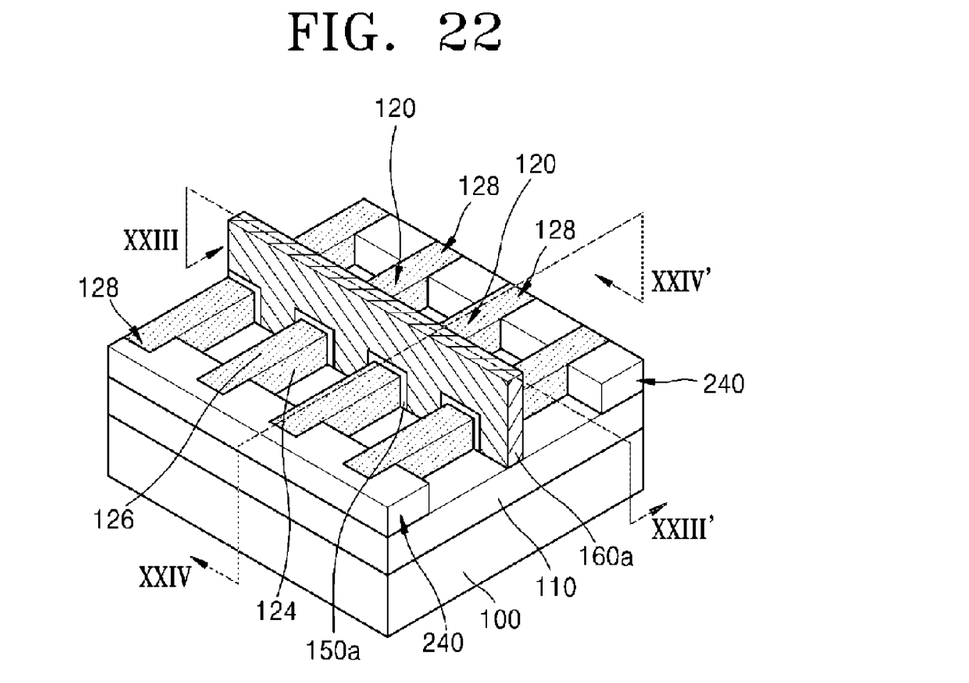

FIGS. 20 through 22 are perspective views illustrating a method of manufacturing a semiconductor device according to a second embodiment of the present invention.

The second embodiment is the same as the first embodiment except that a top surface 242 of a second active region 240 is formed to the same height as top surfaces 126 of slabs 120. Reference numerals of the second embodiment of the present invention in FIGS. 20 through 22 that are identical to reference numerals of the first embodiment denote identical elements.

Referring to FIG. 20, as described with reference to FIGS. 2 through 7, the slabs 120, a mask pattern 130a, and a semiconductor layer 140 are sequentially stacked on a buried oxide layer 110. The semiconductor layer 140 and the mask pattern 130b are planarized by CMP or an etch back method until the top surfaces 126 of the slabs 120 are exposed such that the second active region 240 covering both ends 128 of each of the slabs 120 as well as their surroundings is formed. Consequently, the second active region 240 covers end portions of a first surface 122 and a second surface 124 of each of the slabs 120 while the top surfaces 126 of the slabs 120 are completely exposed. The slabs 120, i.e., the first active region, are connected to one another by the second active region 240. The mask pattern 130b has a top surface that is at almost the same height as the top surfaces of the slabs 120 and remains in gaps between the slabs 120.

Referring to FIG. 21, the mask pattern 130b is removed by ashing and wet-etching As a result, the slabs 120, i.e., the first active region and the second active region 240 connecting the slabs 120 to one another are completely exposed on the buried oxide layer 110. The second active region 240 contacts the ends 128 of each of the slabs 120 and extends in a direction orthogonal to a direction in which the slabs 120 extend. In addition, the second active region 240 has an overlap portion 242 that contacts a portion of the first surface 122 and the second surface 124 of each of the slabs 120. Here, an end surface of the ends of each of the slabs 120 may or may not be covered by the second active region 240. In FIG. 21, the end surface of one end 128 of each of the slabs 120 is illustrated as being covered by the second active region 240 while the end surface of the other end 128 of each of the slabs 120 is illustrated as being not covered by the second active region 240.

A top surface of the second active region 240 is at almost the same height as the top surfaces 126 of the slabs 120, i.e., the first active region. Therefore, the distance between a silicon substrate 100 or the buried oxide layer 110 and the top surface of the second active region 240 is almost the same as the distance between the silicon substrate 100 or the buried oxide layer 110 and the top surfaces 126 of the slabs 120.

Referring to FIG. 22, as described with reference to FIGS. 10 through 17, a gate dielectric layer 150a covering the first surface 122, the second surface 124 and the top surface 126 of each of the slabs 120 and a gate line 160a facing the first surface 122, the second surface 124 and the top surface 126 of each of the slabs 120 with a gate dielectric layer 150a interposed therebetween are formed at approximately the central parts of the slabs 120

Figure 23:
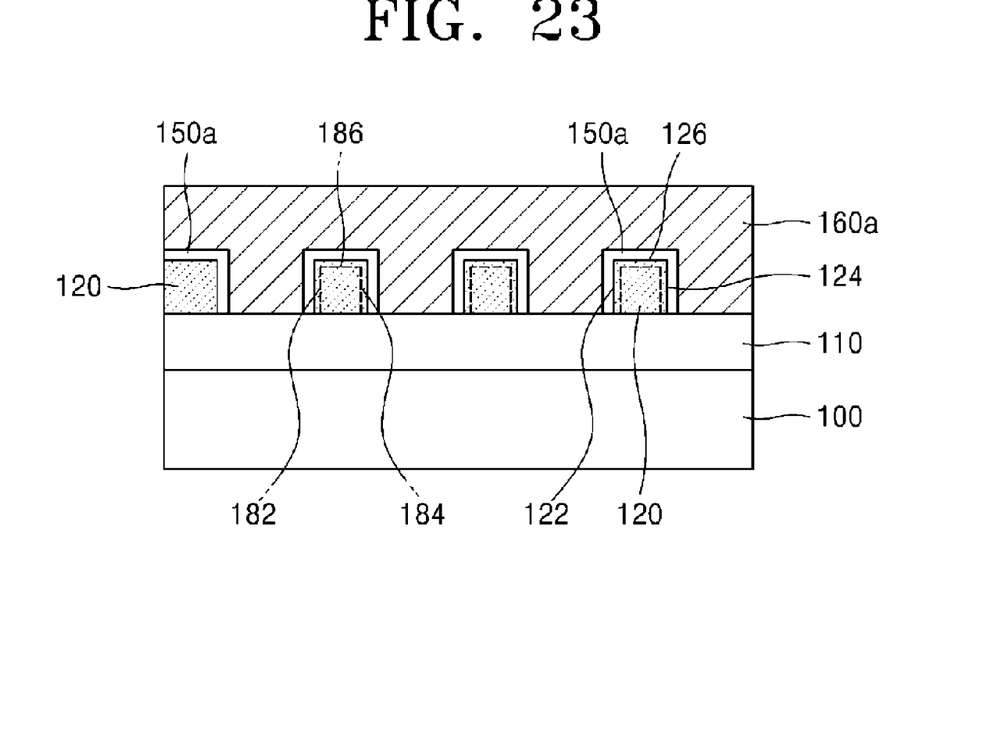
FIG. 23 is a cross sectional view of the semiconductor device taken along a line XXIII-XXIII' of FIG. 22.
Figure 24:
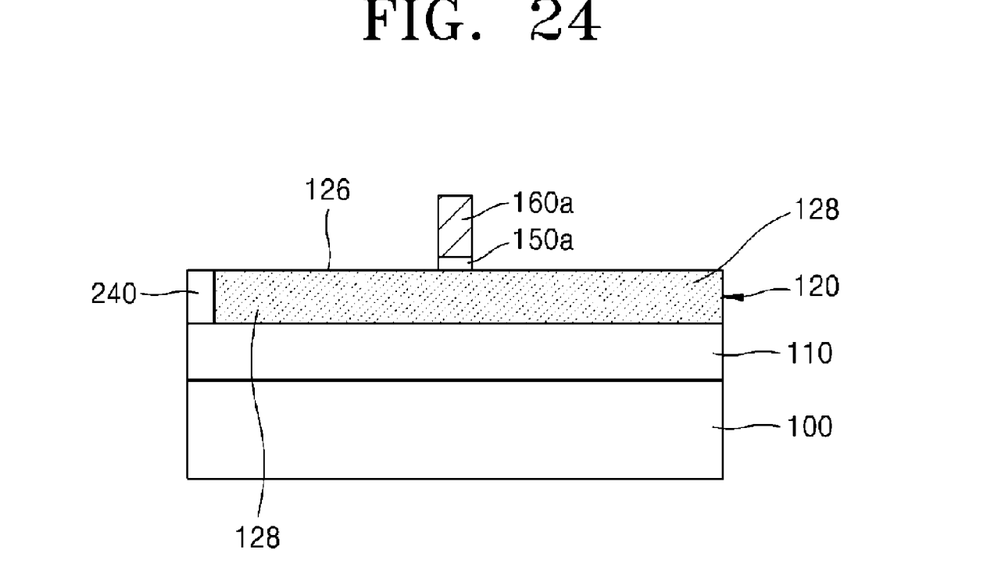
FIG. 24 is a cross-sectional view of the semiconductor device taken along a line XXIV-XXIV' of FIG. 22.

FIG. 23 is a cross sectional view of the semiconductor device taken along a line XXIII-XXIII' of FIG. 22. FIG. 24 is a cross-sectional view of the semiconductor device taken along a line XXIV-XXIV' of FIG. 22.

The view of the configuration of the semiconductor shown in FIG. 23 is almost identical to that of the semiconductor shown in FIG. 18, and, thus, its description will be omitted.

Referring to FIG. 24, the second active region 240 connecting the slabs 120, i.e., the first active region, to one another on the buried oxide layer 110 contacts both of the ends 128 of each of the slabs 120. In addition, the second active region 240a contacts a portion of the first surface 122 and the second surface 124 of each of the slabs 120. The top surface of the second active region 240 is at approximately the same height as the top surfaces of the slabs 120. As illustrated in FIG. 24, the end surface of one end 128 of each of the slabs 120 is covered by the second active region 240 while the end surface of the other end 128 of each of the slabs 120 is not covered by the second active region 240.

The present invention can over problems caused by limitations in controlling a lithography process or an etching process for forming a multi-gate transistor using an OPC. In embodiments of the present invention, a first active region is formed in a line-and-space pattern as slabs. Then, a second active region is formed to connect each of the slabs.

In embodiments of the present invention, the active region is divided into first and second active regions. Therefore, a rounding phenomenon or a 'not open' phenomenon, which may occur due to resolution limitations of the lithography process, can be avoided when forming the active region for the multi-gate transistor with design rule of less than 300 nm. Also, problems caused by CD variations in the active region may be prevented. Although a misalignment may occur when forming a gate line, there is a very low probability that this will lead to a variation in the characteristics of the transistor.

In this regard, a semiconductor device according to embodiments of the present invention may be able to secure a reproducible profile and a controllable CD of an active region stably and provide consistent performance and good electrical characteristics of a multi-gate transistor.

While the present invention has been particularly shown and described with reference to exemplary embodiments thereof, it will be understood by those of ordinary skill in the art that various changes in form and details may be made therein without departing from the spirit and scope of the present invention as defined by the following claims.

INDUSTRIAL APPLICABILITY

The present invention may be applied to the manufacturing of a large-scale, highly integrated LSI circuit device.

The invention claimed is:

1. A semiconductor device comprising:
   a first active region comprising a plurality of slabs formed on a substrate, each slab having a first surface, a second surface facing a direction opposite to the first surface, and a top surface;
   a second active region contacting at least one end of each of the slabs on the substrate to connect the slabs to one another, wherein the second active region has an overlap portion that contacts the first surface, the second surface, and the top surface of each of the slabs;
   a gate line formed on the first surface, the second surface and the top surface of each of the slabs; and
   a gate dielectric layer interposed between the slabs and the gate line.

2. The semiconductor device of claim 1, wherein the first active region is formed in a line-and-space pattern.

3. The semiconductor device of claim 1, wherein the first active region and the second active region are composed of different materials.

4. The semiconductor device of claim 1, wherein the top surface of each of the slabs is disposed a first distance above the substrate, and a top surface of the second active region is disposed a second distance above the substrate, the second distance being equal to or greater than the first distance.

5. The semiconductor device of claim 4, wherein the second distance is greater than the first distance.

6. The semiconductor device of claim 4, wherein the second distance is equal to the first distance.

7. The semiconductor device of claim 1, wherein the second active region contacts both ends of each of the slabs and extends in a direction orthogonal to a direction in which the slabs extend.

8. The semiconductor device of claim 1, wherein the first active region is composed of monocrystalline silicon, and the second active region is composed of polysilicon, amorphous silicon, or a semiconductor compound containing silicon.

9. The semiconductor device of claim 1, wherein the first active region and the second active region form a source/drain region.

10. The semiconductor device of claim 1, wherein the first active region comprises a channel region.

11. The semiconductor device of claim 1, wherein the gate line extends in a direction orthogonal to the direction in which the slabs extend.

12. The semiconductor device of claim 1, wherein the gate line extends parallel to the direction in which the second active region extends.

13. The semiconductor device of claim 1, wherein the gate line is composed of conductive polysilicon, metal, metallic nitride, or metal silicide.

14. The semiconductor device of claim 1, wherein the gate dielectric layer contains $SiO_2$, $SiON$, $Si_3N_4$, $Ge_xO_yN_z$, $Ge_xSi_yO_z$, $HfO_2$, $ZrO_2$, $Al_2O_3$, $TiO_2$, or $Ta_2O_5$.

15. The semiconductor device of claim 1, wherein the substrate is a silicon-on-insulator substrate comprising a buried oxide layer and a silicon layer, and the first active region and the second active region are formed on the buried oxide layer.

16. The semiconductor device of claim 1, further comprising a first channel region and a second channel region respectively adjacent to the first surface and the second surface of each of the slabs in the first active region and facing the gate line.

17. The semiconductor device of claim 16, further comprising a third channel region adjacent to the top surface of each of the slabs in the first active region and facing the gate line.

* * * * *